(12) United States Patent
Mortensen

(10) Patent No.: US 7,508,186 B2
(45) Date of Patent: Mar. 24, 2009

(54) REGISTRATION OF LIGHTNING STRIKE IN A WIND TURBINE

(75) Inventor: Ivan Mortensen, Kolding (DK)

(73) Assignee: LM Glasfiber A/S, Lunderskov (DK)

( * ) Notice: Subject to any disclaimer, the term of this patent is extended or adjusted under 35 U.S.C. 154(b) by 159 days.

(21) Appl. No.: 10/559,632

(22) PCT Filed: Jun. 11, 2004

(86) PCT No.: PCT/DK2004/000409

§ 371 (c)(1),
(2), (4) Date: Dec. 1, 2005

(87) PCT Pub. No.: WO2004/111686

PCT Pub. Date: Dec. 23, 2004

(65) Prior Publication Data

US 2006/0126252 A1 Jun. 15, 2006

(30) Foreign Application Priority Data

Jun. 12, 2003 (DK) .............................. 2003 00882

(51) Int. Cl.
*G01R 31/02* (2006.01)
*H02H 3/22* (2006.01)
(52) U.S. Cl. ........................................ 324/72; 361/117
(58) Field of Classification Search ................... 324/72; 361/117
See application file for complete search history.

(56) References Cited

U.S. PATENT DOCUMENTS 3,760,346 A * 9/1973 Kieser et al. ................. 367/175
5,331,330 A * 7/1994 Susnjara ...................... 342/460
6,612,810 B1 * 9/2003 Olsen et al. ................... 416/95

FOREIGN PATENT DOCUMENTS

| DE | 295 22 152 | 7/1995 |
|----|------------|--------|
| DK | 1999 00443 | 4/2001 |
| EP | 0 663 598 | 7/1995 |

(Continued)

*Primary Examiner*—Timothy J Dole
*Assistant Examiner*—Amy He
(74) *Attorney, Agent, or Firm*—Day Pitney LLP

(57) ABSTRACT

The invention relates to aspects of a method of registering lightning strikes in the blade of a wind turbine, use of such method, a system of exercising the method. The method according to the invention of registering lightning strikes involve that the method comprises that the lightning strike is captured in a receptor arranged in the blade (5) of the wind turbine, and the lightning current is conducted completely or partially through at least one electric resistor (10), thereby heating it, and that it is registered at least that the temperature of the resistor is or was at some point increased. The heating of the electric resistor, ie the increase in temperature, provides simple and reliable registration. This can be extended to also comprise measurement of the amount of energy contained in the lightning current in a very robust and hence very suitable manner for the task. By the invention it is acknowledged that if a lightning current is conducted through a suitable electric resistor, this will "capture" a share of the amount of energy in the same manner as eg an electric radiator or a furnace, ie the resistor is heated by the current as a function of the voltage and the duration and hence of the amount of energy.

22 Claims, 4 Drawing Sheets

FOREIGN PATENT DOCUMENTS

| | | | |
|---|---|---|---|
| EP | 1 036 937 | 9/2000 | |
| JP | 59230172 A | * 12/1984 | ................. 324/72 |
| JP | 433 4889 | 11/1992 | |
| JP | 528 3212 | 10/1993 | |
| WO | WO 00 79128 | 12/2000 | |
| WO | WO 01 77527 | 10/2001 | |
| WO | WO 01 86144 | 11/2001 | |
| WO | WO 02 48546 | 6/2002 | |

* cited by examiner

REGISTRATION OF LIGHTNING STRIKE IN A WIND TURBINE

BACKGROUND OF THE INVENTION

The invention relates to aspects regarding a method of registering lightning strikes in the blade of a wind turbine, a system of exercising the method, exercise on a wind energy plant and a suitable resistor element in the same context.

It is commonly known to equip high structures, such a high-rise buildings, chimneys, antennae and wind energy plants with lightning grounding devices. By means of such lightning grounding devices it is ensured that lightning current is grounded in a responsible manner and without damage to the structure.

In case of eg the blades of a wind turbine, a strike of lightning can be captured by means of receptors, as described more specifically in eg WO 0079128 and WO 0248546, incorporated herein for reference. Essentially, receptors are metallic elements arranged strategically on the blade and being in connection with one or more lightning grounding cables, through which the lightning currents are grounded.

In order to enable estimation of the force of a lightning strike in the blade of a wind turbine, a so-called lightning registration card of a size similar to that of a credit card can be mounted in the blade, as disclosed in EP 0 663 598, wherein a magnetic field generated by a lightning leaves traces on the magnetic strip of the lightning registration card. In this manner it is possible to read the maximal lightning current to which the blade was exposed.

In order to enable this reading, however, it is necessary to stop the wind energy plant and dismount the lightning registration cards in question that may be mounted eg within each blade of the wind turbine. The lightning registration cards can subsequently be read by means of special equipment, whereby the maximal value of the lightning current can be determined. However, it is not possible to determine neither the duration of the lightning strike nor when it happened.

Precisely the duration and point in time of the lightning strike are desirable items of information—on the one hand to enable assessment of the risk of damage, if any, to the blade and, on the other, in connection with insurance issues concerning blades of wind turbines that have been damaged by lightning strikes.

If a lightning current of a certain magnitude—eg 50 kA—is discharged during a few microseconds, ie the duration of the lightning current is quite brief, it is likely that no damage is done, as there has not been time enough for any heating worth mentioning of the blade and the air contained in the blade to have occurred. This is assumed to be linked with the fact that, obviously, when the duration is short, the energy amount is limited. Conversely, in case of a less powerful lightning current of eg 30 kA discharged during a full second, a more powerful heating takes place with ensuing possible damage to the blade. The reason for this is assumed to be the discharge time which results in the amount of energy being many times greater than the more powerful strikes of lightning of shorter duration mentioned earlier.

It is known to measure lightning current and discharge time by means of an oscilloscope or digital recording equipment; however, this equipment is expensive laboratory equipment which is moreover not suitable for mounting in eg the blade of a wind turbine.

BRIEF SUMMARY OF THE INVENTION

It is a starting point of the invention to provide a safe and robust method of registering the presence of a lightning current in the blade of a wind turbine, including that it has occurred and when it occurred. It is a second starting point to provide a method for quantification of the energy amount in a lightning strike in the blade of a wind turbine. It is yet a starting point to provide a wind energy plant, wherein the above-mentioned methods can be exercised, and wherein strikes of lightning can be registered and the amount of energy measured. It is a further starting point to provide systems for determining the magnitude of lightning strikes and for registering lightning strikes, wherein the systems can be built temporarily or permanently into a wind energy plant, including into the blade of a wind turbine. Yet a starting point is to provide a resistor element which is suitable for use when exercising the above-mentioned methods and robust and comparatively inexpensive and can be built integrally with a wind energy plant, including the blade of a wind turbine.

Novel aspects of a method according to the invention for registering at least one lightning strike in the blade of a wind turbine involve that the methods comprise that the lightning strike is captured by a receptor in the blade of the wind turbine, from where the lightning current is completely or partially conducted through at least one electric resistor, thereby heating it, and that the lightning strike is registered on the background of the increase in temperature of the resistor. It is hereby possible to at least verify, immediately or later, that a lightning strike has occurred, on the basis of the registration.

According to a preferred embodiment the registration may comprise that at least one characteristic of at least one lightning strike is determined on the basis of the increase in temperature of the resistor, which characteristic comprises the energy amount contained in the lightning strike determined on the basis of a measurement of the magnitude of the increase in temperature.

The heating of the electric resistor, ie the increase in temperature, yields a simple and reliable measurement of the amount of energy which is simultaneously very robust and therefore very suitable for the task. Lightning currents are usually brief and are of a very fluctuating nature, and therefore it is difficult and presupposes expensive and complex equipment to follow a lightning current throughout its duration and succeed in capturing all fluctuations in order to thereby the able to calculate the discharged amount of energy by integration. By the invention it is acknowledged that if a lightning current is conducted through a suitable electric resistor, this will "capture" a portion of the energy amount in the same manner as eg an electric radiator or furnace, ie the resistor is heated by the current as a function of the current intensity and the duration and hence as a function of the energy amount, and therefore the increase in temperature directly expresses the amount of energy in the lightning current in question. Hereby it is avoided to also have to conduct the lightning current directly through the measurement equipment; thus, it suffices to perform measurements on the resistor, which can be done with comparatively inexpensive and simple equipment, eg an electronic thermometer. As a minimum the method can be used for ascertaining whether there is a difference in the amount of energy in two lightning currents.

According to yet a preferred embodiment, the registration may comprise the point in time of the lightning strike determined on the basis of a measurement of the point in time of the increase in temperature. Thereby associated values can be used eg for comparison to values measured by eg public institutions that monitor and register lightning strikes. Moreover the information regarding the strike of lightning and the point in time it struck will be relevant in insurance matters.

According to a further preferred embodiment the determination of the energy amount contained in the lightning strike is determined on the basis of the magnitude of the increase in temperature of the resistor by use of a pre-defined ratio coefficient defining the ratio of increase in temperature in the electric resistor to the amount of energy of the current conducted through the electric resistor. Hereby it is enabled, on the basis of the increase in temperature, to find the actual amount of energy and not merely to see whether a lightning current contains a smaller or larger amount of energy than some other lightning current—and to do so without complex laboratory measurement equipment, such as an oscilloscope. It is possible to find eg a ratio coefficient by using a number of simulated strikes of lightning having known, varying energy amounts. Such simulated strikes of lightning are conducted through the electric resistor, following which the ensuing increases in temperature in the resistor are measured. Then eg an average value of the ratio of the increases in temperature in the resistor to the actual amounts of energy is used to determine the ratio coefficient.

A preferred use of the method may comprise that the method is exercised on a wind energy plant, wherein at least the measurement of the increase in temperature is used as indicator for assessing the potential extent of damage of a lightning strike in the blade of a wind turbine. Hereby it is accomplished that, on the basis of knowledge of previous strikes of lightning and damage on blades resulting there from, can use the increase in temperature of the resistor to provide an indication of whether a lightning strike has occurred in the blade, and, in the affirmative, which damage it has done. The indication may also give rise to immediate maintenance, service and/or repair being implemented or to indicate whether it can wait. This enables savings on costs of maintenance and service, which—in particular in case of off-shore wind energy plants—are of a considerable magnitude; but being, of course, also of relevance in case of other locations.

Novel aspects of a wind energy plant comprising means for grounding a lightning current, including at least one receptor and at least one grounding connection from the receptor to an external connection to ground involves that the wind energy plant comprises means for measuring an increase in temperature in at least one electric resistor, where the resistor is connected to the receptor or to the grounding connection in a position between the receptor and the grounding, preferably by being inserted serially in the grounding connection and inserted serially between the grounding connection and the receptor, respectively, or by being incorporated in a measurement shunt, measuring bridge or other parallel circuit connected to the grounding connection or to the receptor. Hereby the electric resistor is integrated in the plant and the entire lightning current, or a pre-defined share thereof, will be conducted there through, when or if a lightning strike occurs in the plant and it is captured by the at least one receptor. Hereby measurement of the increase in temperature can be performed as close as possible to the site of strike, whereby it is very likely that the entire lightning current is there and is hence not reduced by transfers to other eg conductive objects, meaning that the measurement is accurate. The increase in temperature is determined by the amount of energy contained in the lightning current, cf above, and is an indicator both that a lightning strike has occurred and whether there is a risk of the plant or parts of the plant having suffered any damage. Receptors and grounding connections are often used in wind energy plants for protection against lightning strikes, and the introduction of the resistor and means for measuring an increase in temperature of an electric resistor and means for monitoring and registering the increase in temperature are this comparatively simple adaptations that are readily performed for implementation on the plant. The implementation may occur both on existing plants and on new plants.

According to one embodiment the resistor and the receptor can be combined or made in one piece whereby there is the shortest distance possible between the site of strike and the site where the increase in temperature is registered and measured, respectively. Hereby the risk is reduced of a part of the lightning current being deflected by transfer before it reaches the resistor.

According to a preferred embodiment the at least one electric resistor can preferably be arranged in at least one blade of a wind turbine of the wind energy plant. Receptors for capturing lightning strikes are often made integrally with the blades, where the receptor is in a position close to the site of strike.

According to a further preferred embodiment the wind energy plant may comprise a number of receptors, which receptors are each connected to an external connection to ground; and wherein at least one electric resistor is connected to each receptor or to the grounding connection between each receptor and the connection to ground to which the receptor is connected; and wherein the wind energy plant comprises means for measuring an increase in temperature in each electric resistor. By this configuration it is possible to read whether a lightning has struck the blade in one receptor or whether the lightning has struck several receptors. However, it is not very likely that a lightning will have several foot points/strike sites during discharge and hence hit several receptors. Alternatively the arrangement can be used for determining which receptor was struck by lightning.

In specific embodiments the wind energy plant may comprise means for determining the amount of energy in the lightning strike on the basis of the size of the increase in temperature and for determining the point in time when the lightning struck on the basis of the point in time of the increase in temperature. Moreover, the wind energy plant may comprise means for storing at least one of the parameters comprising the measured increase in temperature, the determined amount of energy and the determined point in time.

These data can be used to substantiate where, when and how comprehensive were the respective energy discharges resulting from lightning strikes. Thus it is possible to ia accumulate statistic material of when a blade is to be checked for damage due to lightning. For instance, it is perceivable that the part of the blade that is most proximate to the hub of the wind turbine is able to tolerate more or larger strikes of lightning than eg the tip of the blade before servicing is required. By a protocol, ie stored data, of lightning strikes in the relevant blade it is thus possible to plan servicing more accurately, and likewise documentation vis-à-vis an insurance company can also be provided very accurately.

According to a further preferred embodiment means for measuring the increase in temperature in the electric resistor may comprise an electronic thermometer comprising a thermo-element, which thermo-element is arranged in heat-conductive contact with the electric resistor. An electronic thermometer is an inexpensive and robust component that takes up comparatively little space and can hence be integrated anywhere on a wind energy plant, including in a blade.

According to yet an embodiment, means for measuring the increase in temperature in the electric resistor may comprise an infrared thermo-sensor and a cameral for infrared recording, respectively, means for measuring a temperature-related change in resistance in the electric resistor, a non-touch temperature sensor, an optical fibre or other kind of equipment for measuring an increase in temperature. Any of said kinds of equipment for measuring an increase in temperature or change in temperature are suitable for implementing the invention.

According to a preferred embodiment at least the electric resistor can be essentially enshrouded in thermally insulating material. Hereby it is ensured that the increase in temperature is not influenced by the surroundings, whereby the measurement becomes more accurate.

According to yet a preferred embodiment the wind energy plant may comprise means for monitoring and storing registrations of lightning strikes, including optionally characteristics of lightning strikes, which means may comprise a computer unit arranged in direct or wireless connection with means for measuring the increase in temperature, which computer unit is preferably arranged in or at the wind energy plant, including in the blade of a wind turbine. Use of a computer unit provides several advantages, including that processing of measured data, and likewise storage of data, runs smoothly, and likewise it is enabled to externally, eg via the Internet, collect data from the computer unit, eg for use in the planning of servicing.

According to a further preferred embodiment the wind energy plant may comprise means for alerting or halting the wind energy plant in the event of a given increase in temperature in the resistor. This can be used to increase plant safety.

According to yet a preferred embodiment, the wind energy plant may comprise means for dispatching an electronic message, which message may comprise data relating to the increase in temperature. Hereby eg an external recipient can be advised that a lightning strike has occurred and where, when and how powerful it was.

According to yet a preferred embodiment the wind energy plant may comprise means for registering a lightning current, including a lightning registration card comprising at least one magnetic strip. Hereby it is possible to also register the magnitude of the maximal lightning current and not merely the amount of energy.

Novel aspects of a system for use in the registration of at least one strike of lightning in the blade of a wind turbine, said system comprising means for grounding a lightning current, including at least one receptor for mounting in the blade of the wind turbine and at least one lightning grounding cable coupled to the receptor, involve that the system comprises means (16) for measuring an increase in temperature in at least one electric resistor (10), wherein the at least one resistor is adapted for being connected to the lightning grounding cable or to the receptor in such a manner that the resistor will be heated by a lightning current. Hereby the system is suitable for determining the properties of a lightning strike and is able to give in-situ quantification of the amount of energy present in the lightning current, see above regarding the correlation between amount of energy contained in lightning current and the ensuing increase in temperature in the resistor. Thus, in addition to the safety aspect with regard to harmful effects of lightning strikes, the system is able to register that a lightning strike has occurred.

According to a preferred embodiment the resistor can be inserted serially in the grounding connection and inserted serially between the grounding connection and the receptor, respectively, or be incorporated in a measurement shunt, measuring bridge or other parallel circuit connected to the grounding connection or a receptor. Hereby it is an option to let the entire lightning current or merely a pre-defined share thereof be conducted through the resistor.

Novel aspects of a resistor element adapted for conducting a lightning current and heating due to such current involve that the resistor element is configured essentially as an elongate object having at its end an increased expanse transversally to its longitudinal axis. Thereby the resistor element can be provided at its ends with internal threaded holes for eg connector elements for lightning grounding cable without an ensuing undesirable reduction in the conductivity or increase in the electric resistance of the resistor element. Simultaneously a limited expanse is provided transversally to the longitudinal direction, whereby the element is readily integrated since such configuration is not very space-consuming.

According to a preferred embodiment the resistor element can be essentially rotationally symmetrical about its longitudinal axis and comprise an opening adapted for receiving a thermo-element. Thus, the resistor element is suitable for manufacture ia by turning whereby precise measurements are readily accomplished, which is convenient for the manufacture of a number of identical elements, including eg standard elements with very uniform electric resistance. By arrangement of the thermo-element in an opening in the resistor element it is possible to accomplish good thermally conductive contact, which is necessary for a precise measurement. The thermally conductive contact can moreover be enhanced by use of heat-conductive paste.

According to yet a preferred embodiment the resistor element can be manufactured essentially from steel, preferably stainless steel. Stainless steel has a thermal conductivity which is comparatively low compared to carbon steel. The resistor element can also be manufactured from other electrically conductive materials, such as eg tungsten or carbon. Stainless steel is a convenient choice due to its poor heat conductivity and its large thermal capacity which makes it easy to withhold the deposited amount of energy in the resistor element, whereby a very accurate temperature reading is enabled.

In the following the invention will be described in further detail by means of figures that give examples of exemplary embodiments of the invention, wherein:

DETAILED DESCRIPTION OF THE INVENTION

Figure 1:
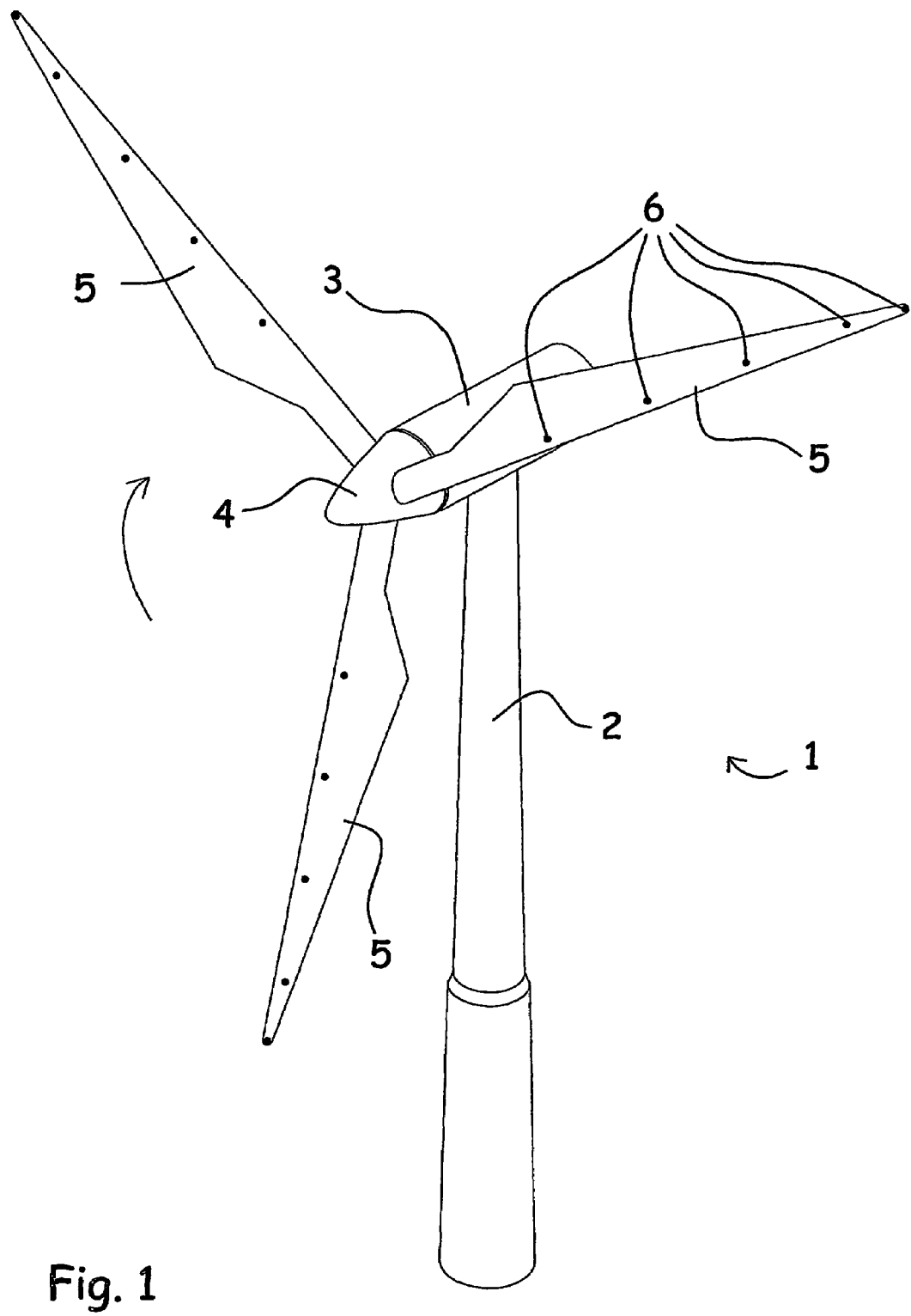
FIG. 1 schematically shows a wind energy plant with three blades equipped with receptors.

FIG. 1 shows a wind energy plant 1 of the type known within the trade as a "wind turbine according to the Danish Concept". Such turbine 1 typically comprises a tower 2, a nacelle 3 with gear and generator (not shown) and a rotor consisting of a hub 4 and three wind turbine blades 5. On the blades 5 and at their outer side receptors 6 are provided that are, via one or more lightning grounding cables, electrically connected to ground. The receptors 6 are metal elements that are mounted at the surface of the blade 5, to the effect that the lightning can be captured on or formed opposite these specific positions. On the shown wind turbine 1, five receptors 6 are mounted on each blade 5, but of course the number can be varied from one blade type to another, depending eg on size. Also the tower 2 and/or the nacelle 3 can be equipped with means for capturing lightning.

Figure 2:
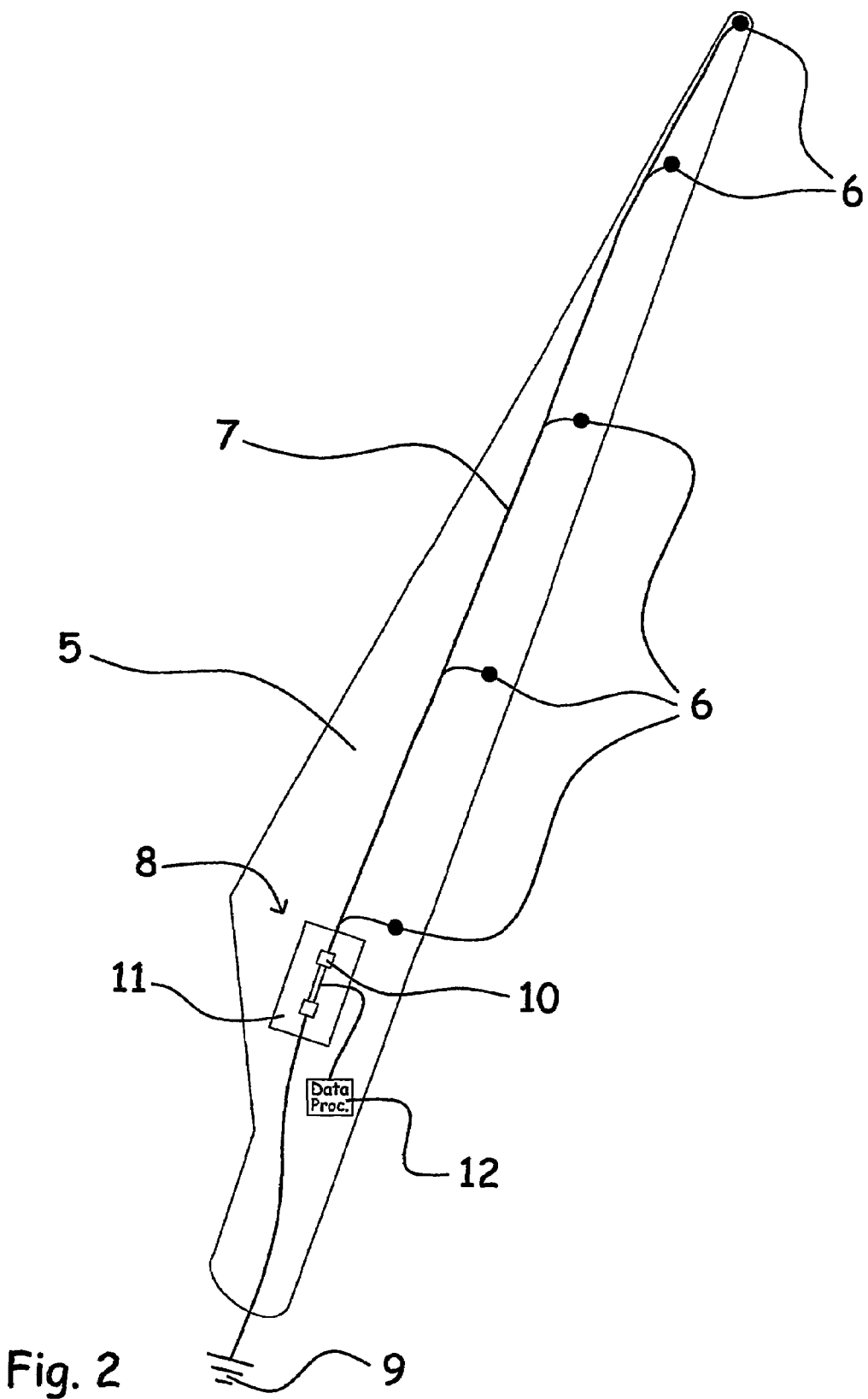
FIG. 2 shows an embodiment of the blade of a wind turbine according to an aspect of the invention.

FIG. 2 shows a blade 5 having five receptors 6 distributed across the longitudinal direction of the blade. These receptors 6 are connected to the same main lightning grounding element 7, typically constituted by a cupper cable or the like, that is grounded 9 via a system 8 for determining the magnitude of the amount of energy contained in one or more lightnings.

By the same configuration of receptors 6, lightning grounding cable 7 and connection to ground 9, means for protecting against lightning, the system 8 can be exchanged for an alternative system that comprises means for registering an increase in temperature in at least one electric resistor that is, via connection to lightning grounding cable 7, inserted between at least one receptor 6 and the connection to ground 9, whereby the resistor will be heated by a lightning current deriving from a lightning strike into a receptor 6. An increase in temperature in excess of the usual variation during the day deriving from heating by the sun will thus be an indication that a strike of lightning has occurred.

Figure 4:
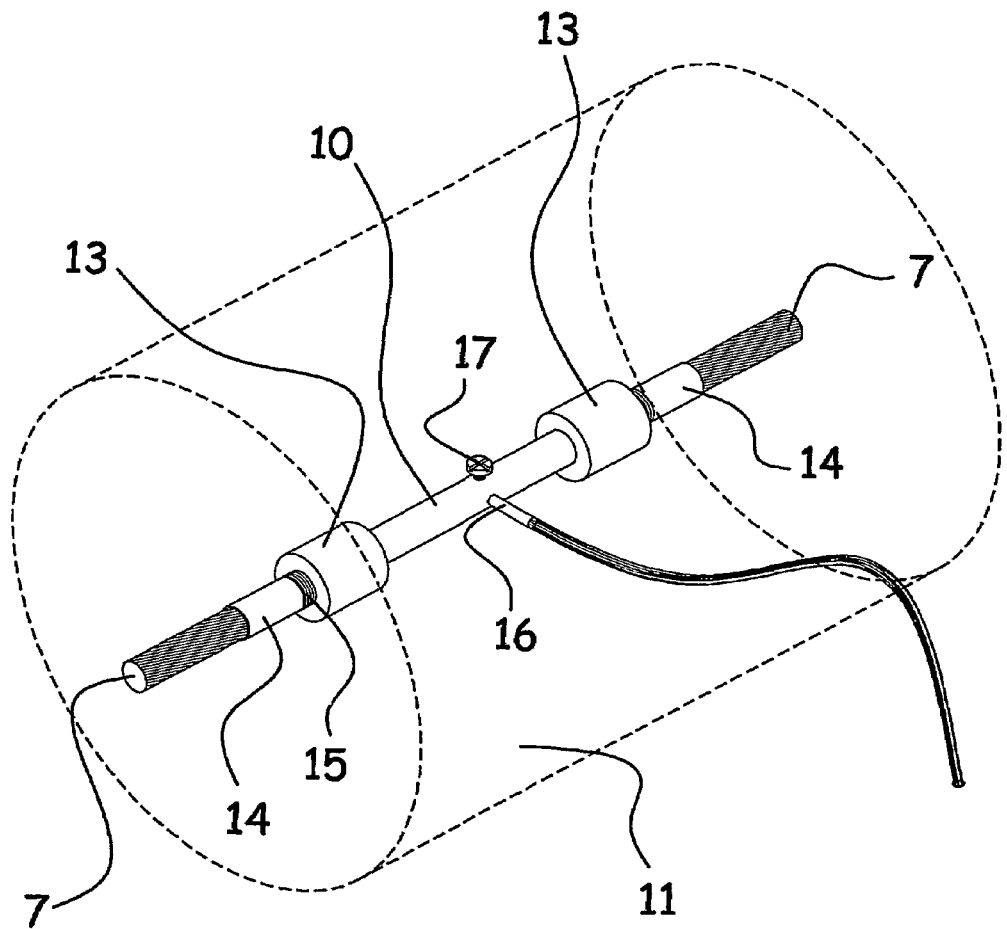
FIG. 4 shows a resistor element having a lightning grounding cable and a thermo-element mounted thereon.

FIG. 2 shows an embodiment of the mentioned system 8 for determining the magnitude of the amount of energy contained in a lightning strike. The system 8 comprises a resistor element 10 used as an electric resistor and being connected to the lightning grounding cable 7 and the connection to ground 9. In the various embodiments, the resistor element 10 can be connected to the receptor 6 or to the grounding connection 7 in a position between the receptor 6 and the connection to ground 9, preferably by being inserted serially into the grounding connection 7 and serially inserted between the grounding connection 7 and the receptor 6, respectively, or by being incorporated into a not shown measurement shunt, measuring bridge or other parallel circuit connected to the grounding connection 7 or to the receptor 6. A lightning strike into a receptor 6 will hence result in a lightning current being completely or partially conducted from the receptor through the resistor element 10 and on to ground 9. When an electric current is conducted through a resistor, energy in the form of heat deposits, ie the lightning current heats the resistor element 10. Besides, the system 8 comprises not shown means for measuring an increase in temperature in the resistor element 10—albeit an example of this is shown in FIG. 4, said means for measuring being coupled to means for registering an increase in temperature, eg data processing equipment 12. The data processing equipment 12 may also comprise means for storing data, means for registering a point in time, means for dispatching an electronic message—directly or wirelessly, means for alerting, eg in the event of a specific increase in temperature, etc. Preferably, the system 8 can be enclosed in a thermally insulating material 11, whereby the heating of the resistor element 10 is not unintentionally affected by external factors, whereby an accurate and reliable measurement is accomplished. In case of a lightning strike in one of the five receptors 6 of the blade, it will thus be possible to read an increase in temperature of the resistor element 10 that can be processed via the mentioned data processing equipment 12, including be converted to an expression of at least the magnitude of the amount of energy in a lightning current caused by lightning strike.

Figure 3:
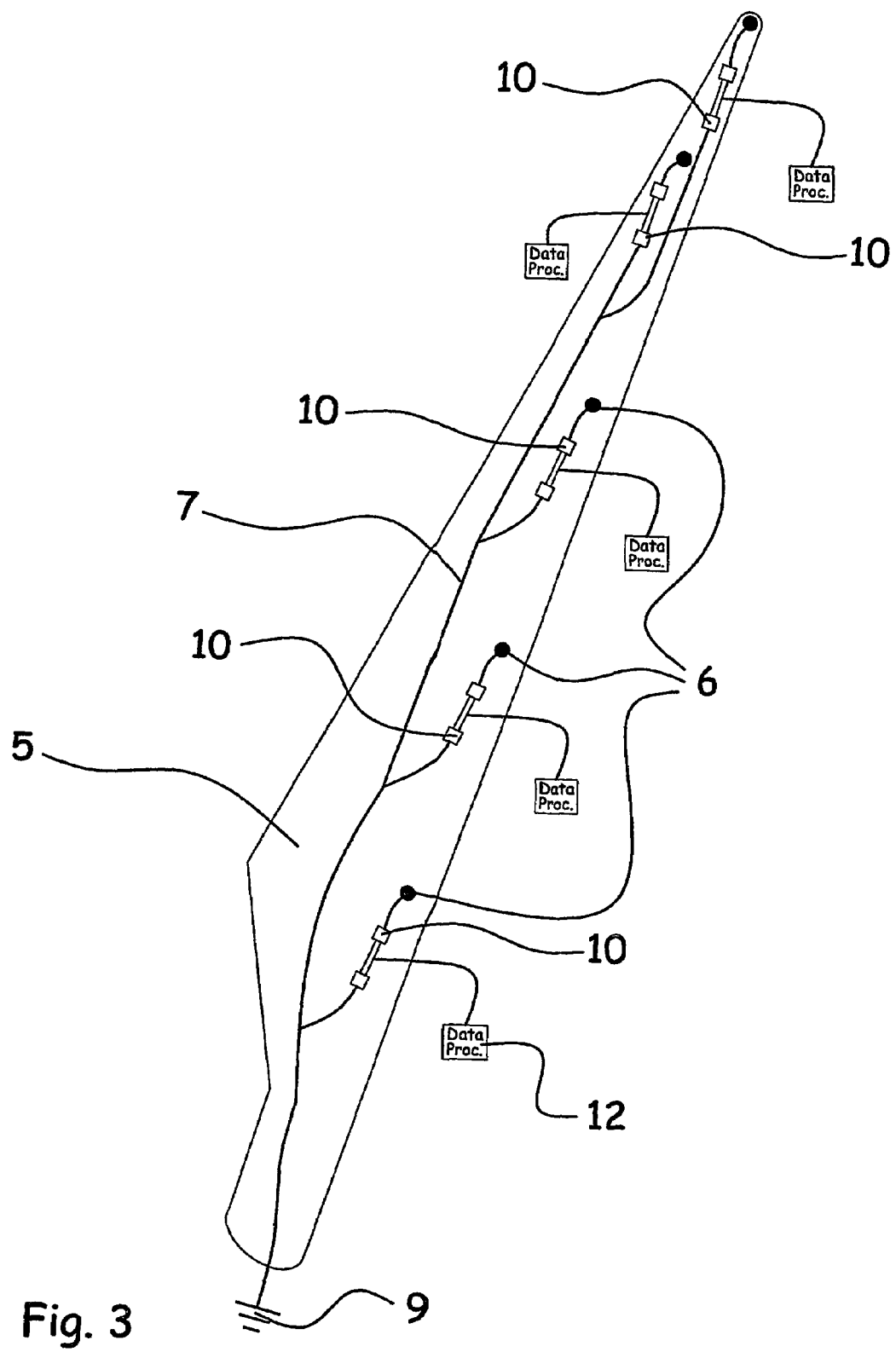
FIG. 3 shows an alternative embodiment of the blade of a wind turbine according to a further aspect of the invention.

FIG. 3 shows a variety in which each receptor 6 is in direct connection with a system for determining the magnitude of the amount of energy contained in a lightning strike. Each receptor is connected to a resistor element 10 and further connected to a connection to ground 9. In the Figure it is shown that each resistor element 10 is connected—via not shown means for measuring an increase in temperature—to each their data equipment 12 (in a manner that corresponds essentially to that mentioned above in the context of the system 8 shown in FIG. 2), but of course the system can also be constructed such that centrally arranged data equipment 12 can handle input from a number of different resistor elements 10. Moreover, it is not required that data processing equipment 12 is to be present in each blade 5 of a wind energy plant; the equipment can be arranged in one of the three blades 5 or in the tower or in the nacelle or in any other location in proximity of the plant and from there receive input from all measurements of lightning strikes in each receptor 6 on any of the blades 5.

As shown in FIG. 3, resistor elements 10 can be mounted in direct connection with each receptor 6 in the blade 5, whereby it is possible to monitor the individual receptor 6 and to register lightning strikes and their amount of energy grounded from the receptor 6 in question.

It is moreover possible to arrange all resistor elements 10 assembled in eg the blade root along with the necessary data processing equipment 12. By this solution a lightning grounding cable 7 is taken from each receptor 6 to each their resistor element 10 and from there it is conducted to ground 9.

FIG. 4 shows an embodiment of a resistance element 10 according to the invention. The resistor element 10 is configured as a rotationally symmetrical object having an increased diameter at the ends 13, which ends 13 are configured in this manner in consideration of the selected type of terminal. The shown type of terminal is configured as sleeves 14 with an external thread 15 mounted at the ends of each lightning grounding cable 7 for cooperation with and connection to the resistor element 10 via threaded bores configured at the ends 13 of the resistor element. In this manner it is ensured that there is sufficient contact face for a lightning current to be transferred from the cable 7 to the resistor element 10 and from then on without a welding occurring between the sleeves 14 and the resistor element 10. It will be obvious to the person skilled in the art that other types of terminals can be used—according to preference—for such joints.

Moreover, FIG. 4 shows a way in which a thermo-element can be attached to the resistor element 10. The shown solution comprises a hole bored into the resistor element 10 for receiving the thermo-element 16. The thermo-element 16 is fixated with a screw 17, whereby a clamp joint is provided. This solution, too, can be provided in a variety of ways. The fundamental is that good contact is ensured between the resistor element 10 and the thermo-element 16 for transfer of heat. This contact is further ensured by use of a heat-conductive paste in the joint. The thermo-element 16 can be connected to a not shown electronic thermometer, which thermometer can be connected to data processing equipment 12, eg a computer unit. Alternatively the thermo-element 16 can be connected directly to data processing equipment 12. For instance the thermometer or the computer unit can be configured for monitoring and registering that an increase in temperature occurs, eg beyond a pre-determined threshold value.

The term 'monitoring' is intended to designate that it is constantly checked whether an increase in temperature occurs. By 'registration' is meant that an increase in temperature is found or detected. By 'measurement of increase in temperature' is meant that the size and/or change of a parameter is found and determined, respectively.

Herein the resistor element 10 is shown with an external thermal insulation 11 outlined schematically by the dotted markings. This insulation 11 ensures a more precise registration of a flash, the difference in temperature being measurable with a much higher degree of precision, when the surroundings emit less heat, and likewise the influence from the surroundings is, at a minimum, reduced.

According to a convenient embodiment of the invention of the blade of a wind turbine 5 of a wind energy plant 1, a resistor element 10 is employed which is rotationally symmetrical and has a length of 200 mm and a cylindrical central section with a diameter of 11.5 mm and has two cylindrical ends with a diameter of 20 mm, said ends each having a length of 50 mm. Moreover, each end is provided with an internal, concentric threaded bore having a depth of 45 mm provided with M10 thread. The M10 thread suits standard cable boxes for coupling with lightning grounding cables 7 from a receptor 6 and a connection to ground 9, respectively, and the depth of the thread enables the cable box to be introduced deeply enough for a sufficient contact area to be accomplished for transfer of the lightning current. The increased diameter of the ends compared to the central section serves the purpose of preventing the internal threaded bores from reducing the cross sectional area too much—likewise with a view to conducting the lightning current. Centrally on the middle of the central section a through-bore is provide having a diameter of 3 mm for receiving a thermo-element 16. Perpendicular to the transverse bore a threaded bore with M3 thread is provided, wherein a fixation screw is provided for ready fixation of a thermo-element 16. The resistor element 10 can be manufactured from Nirosta® (X5CrNi 18-10) available from Thyssen Krupp. A suitably selected thermo-element 16 is arranged and secured in the opening in the central section of the resistor element 10 and is connected to an analog measurement converter type 231, available from LKM Electronic GmbH in Germany and having the property that the thermo-element 16 is galvanically separated from the electronics part of the measurement converter, whereby lightning current is not conducted from the resistor element 10 into the electronics part. The output of the measurement transformer is a norm signal of 4-20 mA. The output of the measurement transformer is coupled to a computer for further processing of measurements. The measurement transformer and the computer are arranged within a metal cabinet that serves as a Faraday cage and protects the measurement transformer and the computer. A power supply cable for the measurement transformer and the computer in the form of a shielded cable or a cable drawn in a metal tubing is advanced to the blade 5 from the hub 4 and further along with the lightning grounding cable 7. The above-mentioned design of the resistor element 10 will enable measurement of increases in temperature for typical lightning currents of up to about 400 K.

The unit "mm" is millimetre.

The unit "mA" is milli Ampere

The unit "K" is Kelvin.

The embodiments shown in FIGS. 1-3 are implementations in connection with up-to-date wind energy plants, but of course the person skilled in the art could easily implement aspects of the invention in other contexts where it is desired to register lightning strikes and determine the fierceness of lightning strikes, respectively, such as in large machine or factory plants, buildings, towers, bridges, etc.

It will thus be understood that the invention as disclosed in the present description and figures can be modified or changed, while continuing to be comprised within the scope of protection of the following claims.

The invention claimed is:

1. A method of registering at least one lightning strike in the blade (5) of a wind turbine, characterised in that the method comprises that the lightning strike is captured by a receptor (6) in the blade of the wind turbine, from where a lightning current is completely or partially conducted through at least one electric resistor (10), thereby heating it; and that the lightning strike is registered on the basis of the increase in temperature of the resistor; and that the at least one characteristic of at least one lightning strike is determined on the basis of the increase in temperature of the resistor, said characteristic comprising the amount of energy contained in the lightning strike determined on the basis of a measurement of the magnitude of the increase in temperature.

2. A method according to claim 1, characterised in that the point in time of the lightning strike is determined on the basis of a measurement of the point in time of the increase in temperature.

3. A method according to claim 1, characterised in that the determination of the amount of energy contained in the lightning strike on the basis of the magnitude of the increase in temperature of the resistor is performed by use of a pre-calculated or measured ratio coefficient that defines the ratio between an increase in temperature in the electric resistor (10) and the amount of energy of the lightning current conducted through the electric resistor (10).

4. A method according to claims 1, characterised in that said characteristic is used as an indicator for assessing the potential extent of damage made by said lightning strike in the blade (5) of the wind turbine.

5. A wind turbine (1) comprising means for grounding a lightning current, including at least one receptor (6) and at least one grounding connection (7) from the receptor to an external connection to ground (9), characterised in that the wind turbine comprises means (16) for measuring an increase in temperature in at least one electric resistor (10) and means for determining the amount of energy contained in a lightning strike on the basis of the magnitude of the increase in temperature, wherein the resistor (10) is connected to the receptor (6) or to the grounding connection (7) in a position between the receptor (6) and the connection to ground (9), preferably by being inserted serially in the grounding connection (7) and serially inserted between the grounding connection (7) and the receptor (6), respectively, or by being incorporated into a measurement shunt, a measuring bridge or other parallel circuit connected to the grounding connection (7) or to the receptor (6).

6. A wind turbine (1) according to claim 5, characterised in that the resistor (10) and the receptor (6) are interconnected or made integrally.

7. A wind turbine (1) according to claim 5, characterised in that the at least one electric resistor (10) is preferably arranged in a blade (5) of the wind turbine (1).

8. A wind turbine (1) according to claim 5, characterised in that the wind turbine comprises a number of receptors (6), said receptors being each connected to an external connection to ground (9); and that at least one electric resistor (10) is connected to each receptor (6) or to a grounding connection (7) between each receptor (6) and the connection to ground (9) to which the receptor is connected; and that the wind turbine comprises means for measuring (16) an increase in temperature in each electric resistor.

9. A wind turbine (1) according to claim 8 characterised in that the wind turbine comprises means for storing at least one of the parameters comprising the measured increase in temperature, a determined amount of energy and a determined point in time.

10. A wind turbine (1) according to claim 8, characterised in that means for measuring (16) the increase in temperature in the electric resistor (10) comprises an electronic thermometer comprising a thermo-element (16), which thermo-element is arranged in thermally conductive contact with the electric resistor.

11. A wind turbine (1) according to claim 8, characterised in that means for measuring the increase in temperature in the electric resistor (10) comprises an infrared thermo-sensor and a camera for infrared recording, respectively, means for measuring a temperature-related change in resistance in the electric resistor, a non-touch temperature sensor, an optical fibre or some other kind of equipment for measuring an increase in temperature.

12. A wind turbine (1) according to claim 5, characterised in that the wind turbine comprises means for determining a point in time of a lightning strike on the basis of a point in time of an increase in temperature.

13. A wind turbine (1) according to claim 5, characterised in that at least the electric resistor (10) is essentially enshrouded in thermally insulating material (11).

14. A wind turbine (1) according to claim 5, characterised in that the wind turbine comprises means (12) for monitoring and storing registrations of lightning strikes, including optionally also characteristics of lightning strikes, said means comprising a computer unit arranged in direct or wireless connection with means (16) for measuring the increase in temperature, said computer unit being preferably arranged in or at the blade (5) of the wind turbine, including in the blade (5) of a wind turbine.

15. A wind turbine (1) according to claim 5, characterised in that the wind turbine comprises means of alerting or halting the wind turbine at a given increase in temperature in the resistor (10).

16. A wind turbine (1) according to claim 5, characterised in that the wind turbine comprises means for dispatching an electronic message, said message comprising data relating to the increase in temperature.

17. A wind turbine (1) according to claim 5, characterised in that the wind turbine comprises means for registering a lightning current, including a lightning registration card comprising at least one magnet strip.

18. A wind turbine (1) according to claim 5, characterized in that the resistor is configured essentially an elongate object having at its ends (13) an increased expanse transversally to its longitudinal axis.

19. A wind turbine (1) according to claim 5, characterized in that the resistor is essentially rotationally symmetrical about its longitudinal axis and comprises an opening adapted for receiving a thermo-element (16).

20. A wind turbine (1) according to claim 5, characterized in that the resistor is manufactured from steel, preferably stainless steel.

21. A system (8) for use in the registration of at least one lightning strike in a blade of a wind turbine, said system comprising means for grounding a lighting current, including at least one receptor (6) for mounting in the blade (5) of the wind turbine, and at least one lightning grounding cable (7) coupled to the receptor (6), characterised in that the system comprises means (16) for measuring an increase in temperature in at least one electric resistor (10), and characterized in that the system comprises means for determining the amount of energy contained in a lightning strike on the basis of the magnitude of the increase in temperature, wherein the at least one resistor is adapted to be coupled to the lightning grounding cable (7) or to the receptor (6) and be inserted between the ground (9) and the receptor (6), respectively, in such a manner that the resistor will be heated by a lightning current.

22. A system (8) according to claim 21, characterised in that the resistor (10) is inserted serially in the lightning grounding cable (7) and inserted serially between the ground (9) and the receptor, respectively, or is incorporated into a measurement shunt, measuring bridge or other parallel circuit connected to the grounding connection or a receptor (6).

* * * * *